United States Patent
Freund et al.

[11] Patent Number: 6,039,833
[45] Date of Patent: Mar. 21, 2000

[54] METHOD AND APPARATUS FOR COMPONENT PICKUP

[75] Inventors: Joseph Michael Freund, Fogelsville; George John Przybylek, Douglasville; Dennis Mark Romero, Allentown, all of Pa.

[73] Assignee: Lucent Technologies Inc., Murray Hill, N.J.

[21] Appl. No.: 09/034,844

[22] Filed: Mar. 4, 1998

[51] Int. Cl.[7] .................................................. B32B 35/00
[52] U.S. Cl. .......................... 156/344; 156/584; 438/464; 438/976; 29/426.6
[58] Field of Search .................................... 156/344, 584; 29/426.1, 426.5, 426.6; 438/464, 476, FOR 386

[56] References Cited

U.S. PATENT DOCUMENTS

| | | | |
|---|---|---|---|
| 4,296,542 | 10/1981 | Gotman | 438/464 X |
| 4,921,564 | 5/1990 | Moore | 156/344 |
| 4,990,051 | 2/1991 | Safabakhsh et al. | 156/344 |
| 5,827,394 | 10/1998 | Lu | 156/344 |
| 5,851,664 | 12/1998 | Bennett et al. | 428/355 BL |
| 5,911,850 | 6/1999 | Zung | 156/344 |

*Primary Examiner*—Mark A. Osele

[57] ABSTRACT

A method and apparatus for removing a component retained to a film carrier by an adhesive bonding force exerted on the component by the film carrier. The method includes the steps of supporting a section of the film carrier lying beneath the component; pulling a portion of the supported film carrier section away from the component to substantially reduce the adhesive bonding force exerted on the component by the film carrier; and lifting the component off the film carrier. The apparatus for performing the method includes a convex-shaped base element having a slot which applies at least a partial vacuum that pulls the portion of the film carrier away from the component and a component pickup element for lifting the component off the film carrier.

10 Claims, 4 Drawing Sheets

METHOD AND APPARATUS FOR COMPONENT PICKUP

FIELD OF THE INVENTION

This invention relates to a method and apparatus for removing components from a film carrier. The method and apparatus provide repeatable, damage-free removal of the components from the carrier.

BACKGROUND OF THE INVENTION

Component pickup devices are important in the commercial production of electrical and optical systems. These devices must efficiently handle various electrical and optical components with precision and care.

Typical component pickup devices include a camera guided robotic arm with a vacuum pickup tool disposed at the working end of the arm. The vacuum pickup tool may include a collet that defines a sealing or pickup surface, and an orifice or passage which extends through the collet and couples to a vacuum source.

The components are typically supplied in bulk on a film or tape carrier for automatic handling by a component pickup device. The components are bonded to the carrier by an adhesive disposed on one side of the carrier. The components are removed from the carrier by the pickup device so that they may be placed, for example, on a circuit board.

A pin assembly is typically provided to assist removal of the components from the carrier. The adhesive force bonding the component to the film carrier is generally greater than the vacuum force exerted on the component by the pickup device. Consequently, a pin assembly is provided for lowering the adhesive force below that of the vacuum force. The pin assembly accomplishes this by pushing the component away from the film carrier prior to removal by the pickup device. With the adhesive force lowered below that of the vacuum force, the pickup tool can successfully lift the component from the carrier.

Unfortunately conventional pin assemblies can damage delicate components and their reliability is less than satisfactory. It has been found that the pressure applied by the pin assembly marks the component. Such marks often crack or damage the components, leading to component failure. Moreover, it is often difficult for the pin assembly to lift the component so that the planar surface of the component is kept parallel to the collet's pickup surface. The pin assembly often rotates or tilts the component slightly, causing the planar surface of the component to lie at an angle relative to the pickup surface of the collet. This causes camera vision problems which interfere with the robotic arm's ability to find the component on the film carrier. The tilting of the component may also prevent a vacuum seal at the planar surface/pickup surface interface. Consequently, the pickup tool is unable to repeatably remove all the components from the carrier.

Accordingly, there is a need for a method and apparatus which removes the components from the film carrier in a repeatable, damage-free manner.

SUMMARY

In accordance with invention a component retained to a film carrier by an adhesive bond is removed without the use of pin assemblies by supporting a section of the film carrier lying beneath the component and pulling a portion of the film carrier section away from the component to partially break the adhesive bond. The component is then vacuum lifted off the film carrier.

The apparatus for performing the method includes a film carrier puller and a component pickup element. The film carrier puller pulls the portion of the film carrier away from the component. The pickup element vacuum lifts the component off the film carrier.

BRIEF DESCRIPTION OF THE DRAWINGS

The advantages, nature and various additional features of the invention will appear more fully upon consideration of the illustrative embodiments described in detail below, considered together with the accompanying drawings. In the drawings.

It should be understood that the drawings are for purposes of illustrating the concepts of the invention and are not to scale.

DETAILED DESCRIPTION

Figure 1:
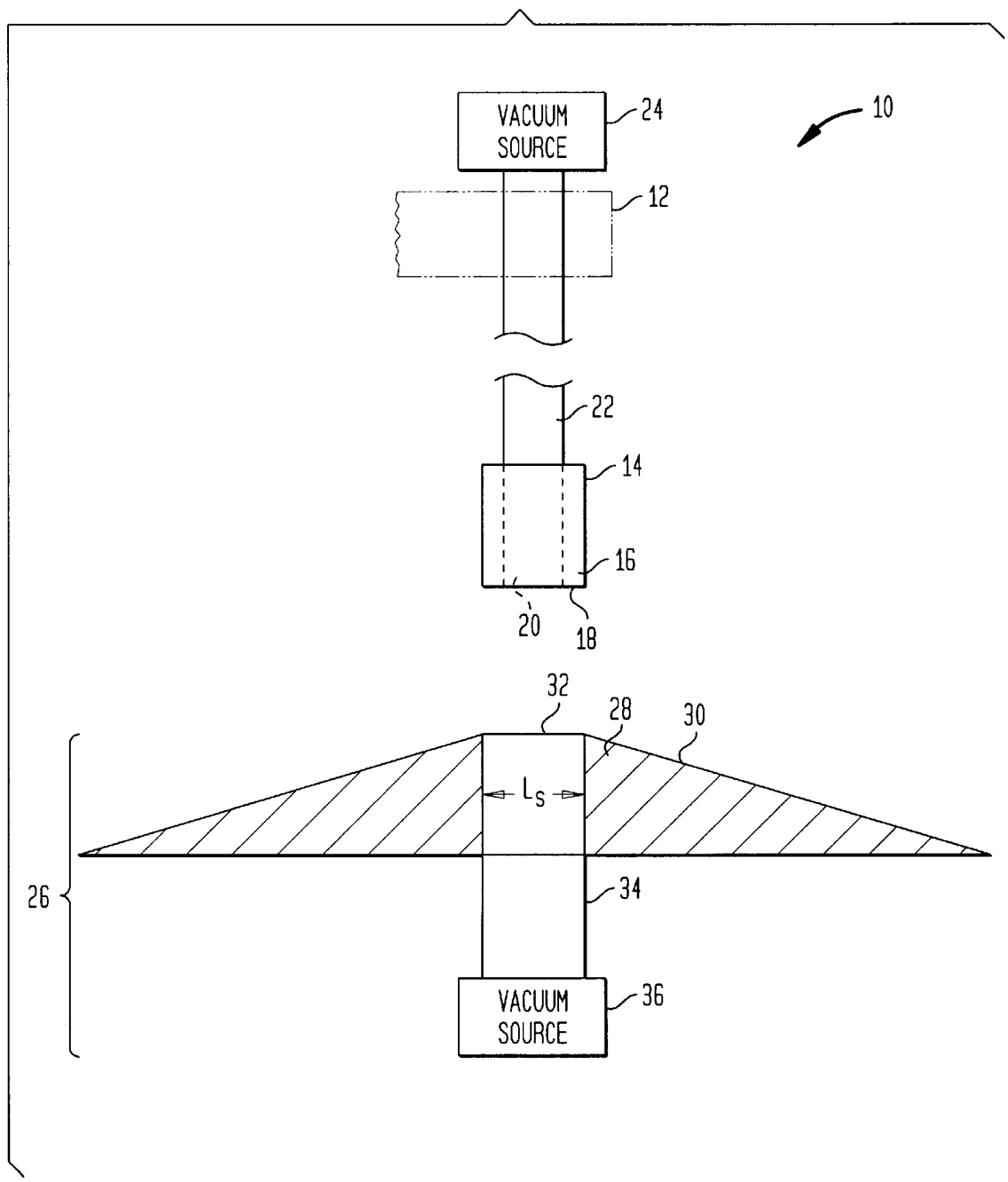
FIG. 1 is a partially sectioned, elevational view of the apparatus according to an embodiment of the invention.

FIG. 1 is a partially sectioned, elevational view of a component pickup apparatus 10 comprising a camera-guided robotic arm 12 and film carrier puller 26. The robotic arm 12 includes an attached vacuum pickup tool 14.

The vacuum pickup tool 14 includes a collet 16 that defines an annular pickup or vacuum sealing surface 18. The vacuum sealing surface 18 surrounds an orifice 20 that extends through the collet 16 and communicates with the first end of a vacuum port 22. The second end of the vacuum port 22 is coupled to a first vacuum source 24. The robotic arm 12 moves under operator or computer control in a well-known manner.

The film carrier puller 26 includes a base member 28 having a convex-shaped carrier guide surface 30 and a centrally disposed vacuum slot 32. The vacuum slot extends 32 through the base member 28 and communicates with the first end of a second vacuum port 34. The second end of the vacuum port 34 is coupled to a second vacuum source 36. The slot has a length $L_S$ which is preferably slightly less than the length of the components.

Figure 2A:
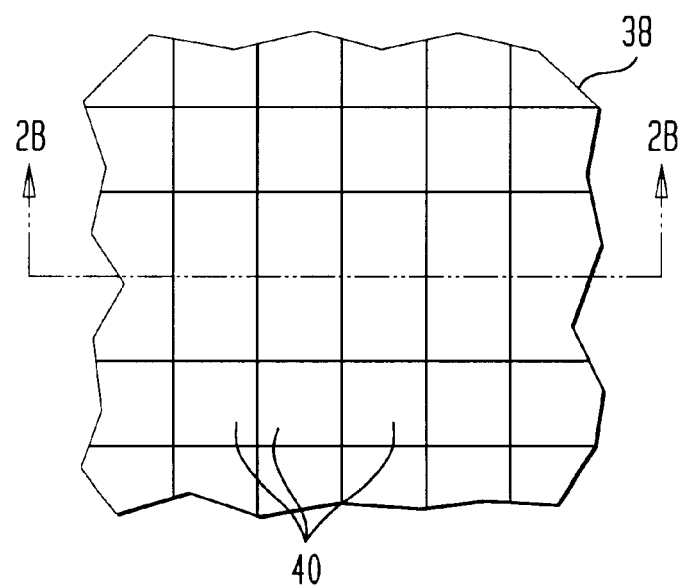
FIG. 2A is a top elevational view showing a section of the film carrier.

FIG. 2A is a top elevational view showing a section of a film carrier 38. Components 40, such as semiconductor chips, are bonded to one side of the film carrier 38 so that the components 40 can be handled in bulk by the apparatus. The components 40 may be arranged on the film carrier 38 in an X-Y array of rows and columns.

Figure 2B:
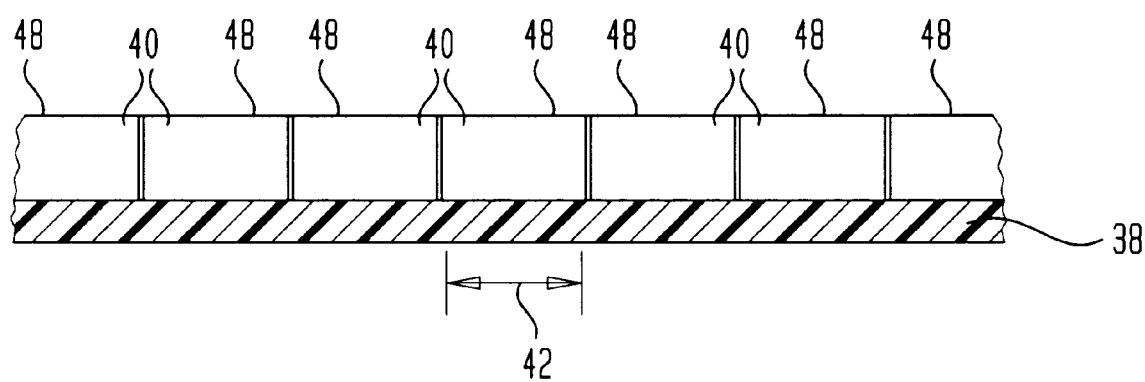
FIG. 2B is a cross-sectional view through line 2B—2B of FIG. 2A.

FIG. 2B is a cross-sectional view through line 2B—2B of FIG. 2A. The components 40 each have a planar top surface 48 which is capable of forming a vacuum seal with the sealing surface 18 of the collet 16. The section 42 of the film carrier 38 directly below each component 40 exerts an adhesive force on the component 40. This adhesive force retains the component 40 to the film carrier 38.

The preferred film carrier is composed of a vinyl material having a thickness of no greater than 2 mils. Vinyl film carriers advantageously do not require an external layer of adhesive for bonding the components thereto. Instead, constituents contained within the vinyl film operate to adhesively bond the components to the film's surface. Such vinyl film carriers are described in U.S. patent application Ser. No. 08/970,982 filed Nov. 13, 1997 by Freund et al., the disclosure of which is incorporated herein by reference.

It should be understood that film or tape carriers with external adhesive coatings may be used in place of the preferred vinyl film carrier. Adhesive coated film or tape component carriers are well known in the art and therefore, need not be described in further detail herein.

Figure 3A:
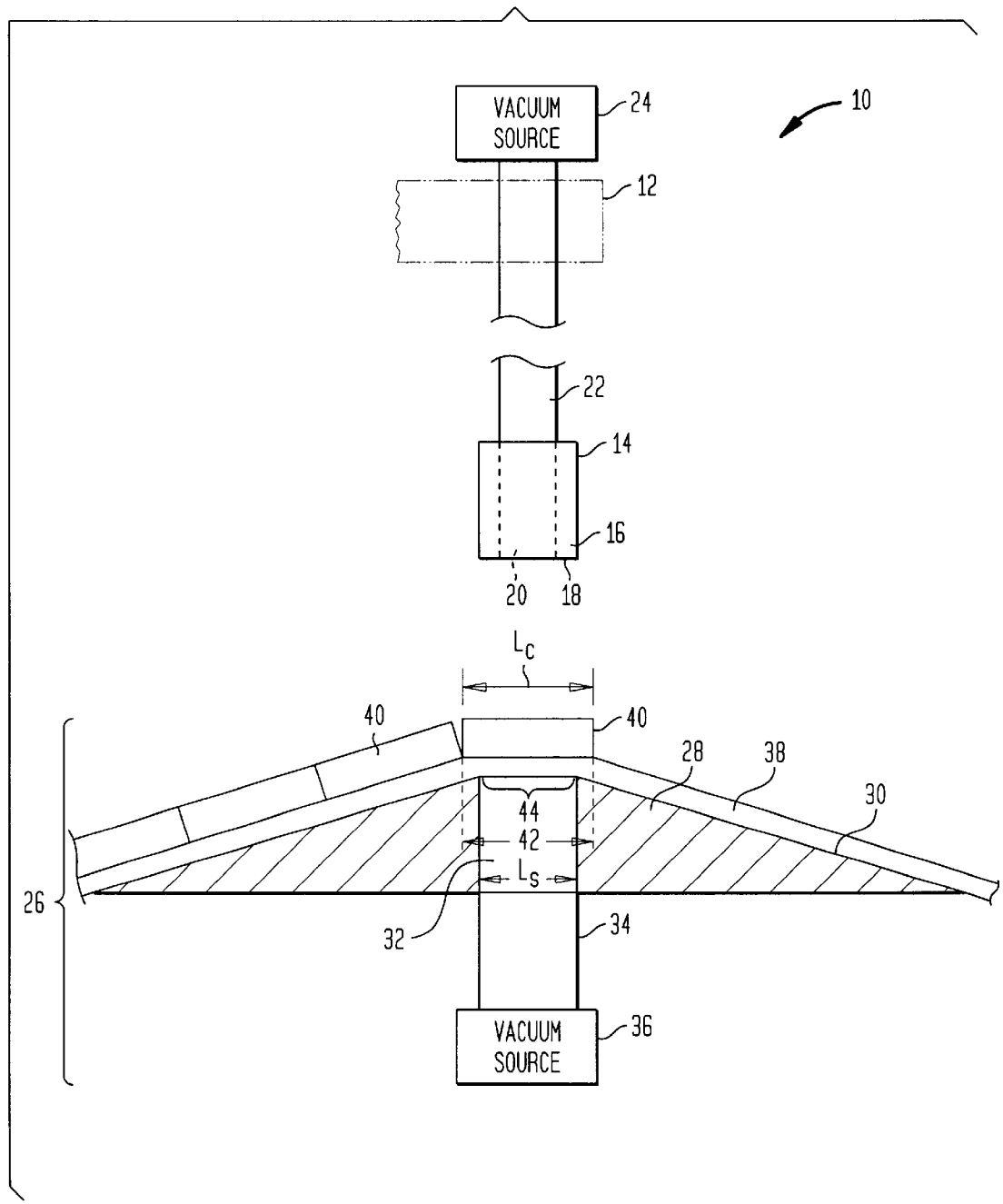
FIGS. 3A and 3B are partially sectioned, elevational views showing how the apparatus of FIG. 1 may be used for removing components from a film carrier.
Figure 3B:
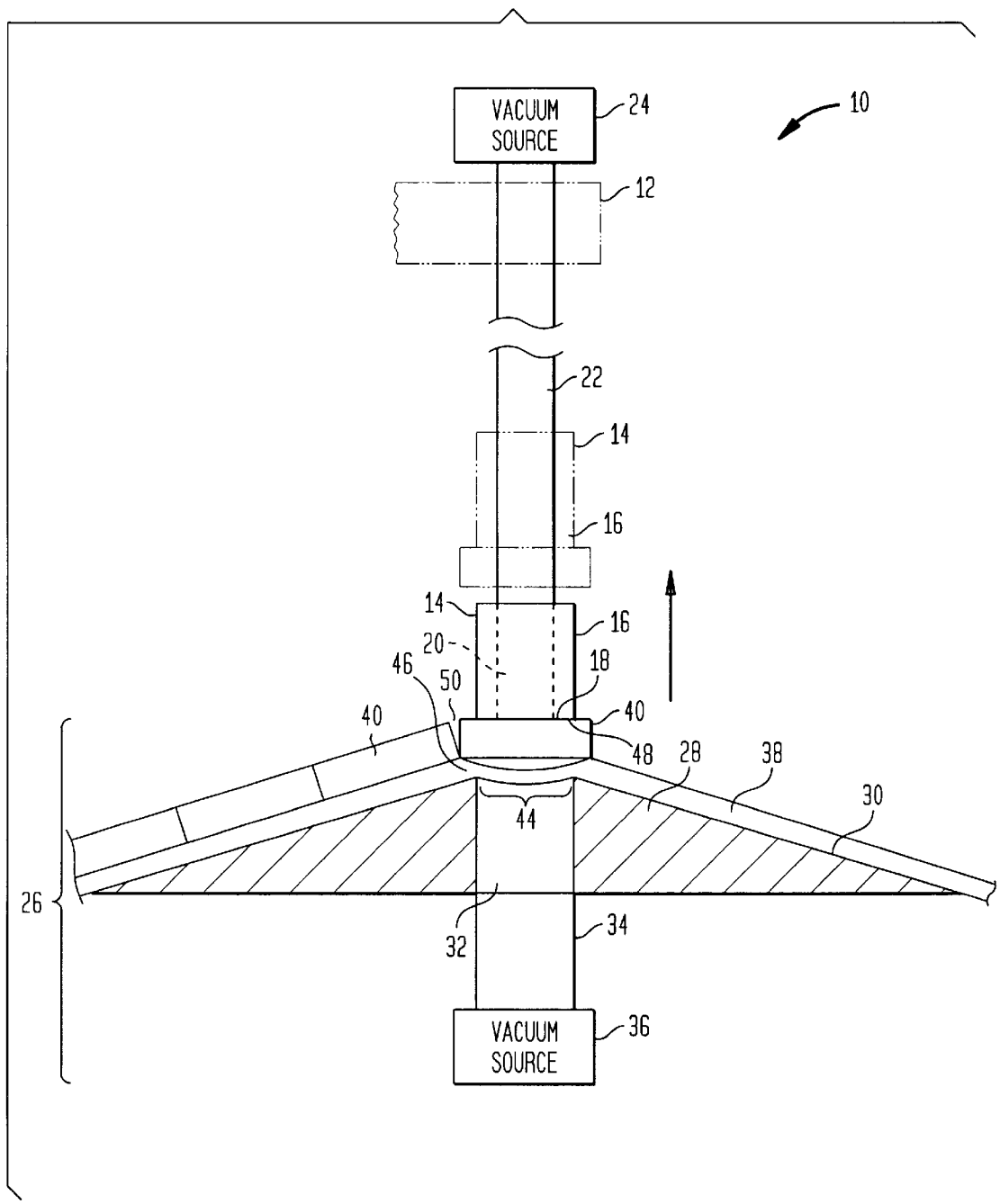

FIGS. 3A and 3B are partially sectioned, elevational views showing how the apparatus 10 of FIG. 1 may be used for removing components from a film carrier. The edges of the film carrier 38 are first attached to an X-Y stage (not shown) of the apparatus 10 so that the base member 28 pushes up on the back surface of the film carrier 38. A component 40 is removed by first locating the component 40 over the slot 32 in the raised member 28 as shown in FIG. 3A. This is accomplished by moving the film carrier laterally with the X-Y stage in the appropriate X and/or Y directions. Since the length $L_S$ of the slot 32 is slightly less than the length $L_C$ of the component 40, a small segment of the component 40 and its corresponding section 42 of the film carrier 38 extend outside of the slot 32, supported by the inclined guide surface 30.

A vacuum force is exerted on the portion 44 of the film carrier section 42 overlying the slot 32. This is accomplished by creating at least a partial vacuum in the slot 32 by drawing a vacuum through the second vacuum port 34 with the second vacuum source 36. The vacuum force must be sufficient to overcome the adhesive bonding force exerted on the component 40 by the film carrier portion 44. This causes the film carrier portion 44 to separate from the bottom of the component 40 and be pulled into the slot 32 as shown in FIG. 3B. The portion 46 of the film carrier section 42 extending beyond the slot 32 remains in contact with the bottom of the component 40. Accordingly, the adhesive bonding force applied to the component 40 by the film carrier section 42 is reduced. The amount of reduction is controlled by the area of the slot 32 and thus, the area of the film carrier portion 44 pulled from the bottom of the component 40. The area of the slot 32 should be sized so that the adhesive bonding force is reduced substantially below that of the vacuum force exerted by the vacuum pickup tool 14.

During this process, the planar top surface 48 of the component 48 remains parallel to the sealing surface 18 of the collet 16. The convex-shaped surface 30 of the base member 28 pushing up on the bottom of the film carrier 38 stretches and bends the film carrier 38 over the base member 28 creating a vacuum tight seal therebetween. The bending of the film carrier 38 lifts and separates the component 40 to be removed from adjacent components 40 and thus, preventing interference at the location indicated by numeral 50. Moreover, damage caused during component removal is minimized as there are no pin assemblies contacting the components or the film carrier.

The collet is then lowered against the planar surface 48 of the component 40. At least a partial vacuum is created in the collet orifice 20 by drawing a vacuum through the first vacuum port 22 with the first vacuum source 24. Since the adhesive force exerted by the carrier film support 42 is substantially lower than the vacuum force exerted by the pickup tool 14, the pickup tool 14 lifts the component 40 from the carrier film 38.

The timing of the vacuum sources 24, 36 and the vacuum pickup 14 may be controlled manually or by computer in a well-known manner. The second vacuum source 36 should be capable of maintaining approximately 20 inches of mercury.

In other embodiments of the invention, the film carrier may comprise a continuous web having components disposed thereon in an inline manner. Components supplied on film carriers embodied in this manner would be suitable for reel to reel applications.

It should be understood that the above described embodiments are illustrative of only a few of the many possible specific embodiments which can represent applications of the principles of the invention. Numerous and varied other arrangements can be devised by those skilled in the art without departing from the spirit and scope of the invention.

What is claimed is:

1. A method for removing a component retained to a film carrier by a bonding force exerted on the component by the film carrier, the method comprising the steps of:

supporting a section of the film carrier lying beneath the component on a base member having a convex-shaped surface and a vacuum slot adjacent the apex of the convex-shape; whereby the component is aligned over the vacuum slot and the slot is sized smaller than the length of the component so that the component is supported over the slot by the base member;

pulling a portion of the supported film carrier section into the slot with a force consisting essentially of vacuum force so that the film is pulled away from the component to substantially reduce the bonding force exerted on the component by the film carrier; and vacuum lifting the component off the film carrier.

2. The method according to claim 1, wherein said step of vacuum lifting includes the steps of:

lowering a component pickup element onto the component;

applying a vacuum force to the component with the pickup element; and raising the pickup element while maintaining the second vacuum force.

3. The method according to claim 2, wherein the vacuum force is greater than the substantially reduced bonding force exerted by the film carrier.

4. The method according to claim 1, wherein the film carrier comprises a vinyl film.

5. The method according to claim 1, wherein the component comprises a semiconductor chip.

6. The method of claim 1, in which no pins or ejector devices are placed against the surface of the film carrier or the component.

7. The method of claim 6, in which the base member has a fixed convex shape and the film carrier is stretched over the convex-shaped base member as the portion of the film carrier is pulled by vacuum force into the slot.

8. An apparatus for removing a component adhered to a film carrier by a bonding force, the apparatus comprising:

a base member having a convex-shaped surface for supporting the film carrier and a vacuum slot opening at the apex of the convex-shaped surface, the length of the vacuum slot being sized smaller than the length of the component so that the component may be supported by the base member while suspended over the slot;

a first vacuum source for exerting a vacuum force in the vacuum slot so that when the film carrier is supported on the base member with the component suspended over the slot, the first vacuum source may be activated to pull by vacuum force a portion of the film carrier into the slot away from the component to substantially reduce the bonding force exerted on the component by the film carrier;

a component pick-up element, the pick-up element being coupled to a second vacuum source oppositely disposed from the first vacuum source for lifting the component off the film carrier.

9. The apparatus of claim 8 in which the base member is configured such that the component may be suspended over no more than one slot.

10. The apparatus of claim 8 in which the base member has a fixed convex shape.

* * * * *